United States Patent

Vaden

[15] 3,678,437

[45] July 18, 1972

[54] FLAT CABLE WAFER

[72] Inventor: James L. Vaden, Tustin, Calif.

[73] Assignee: International Telephone and Telegraph Corporation, New York, N.Y.

[22] Filed: Dec. 30, 1970

[21] Appl. No.: 102,717

[52] U.S. Cl. ...........................339/18 C, 174/68.5, 339/17 F

[51] Int. Cl. ...........................H01r 29/00

[58] Field of Search ...................339/17, 18 R, 18 C; 174/84, 174/84.1, 68.5, 117 R, 117 F, 117 FF; 219/209, 256, 414, 507–509, 522, 541; 317/101 A

[56] References Cited

UNITED STATES PATENTS

| | | | |
|---|---|---|---|
| 3,499,098 | 3/1970 | McGahey et al. | 339/18 C X |
| 3,546,775 | 12/1970 | Lalmond et al. | 339/17 F X |
| 3,155,809 | 11/1964 | Griswold | 339/18 C |
| 2,977,672 | 4/1961 | Telfer | 339/18 C |
| 3,393,392 | 7/1968 | Shelley | 339/17 F |
| 3,133,773 | 5/1964 | Ecker | 339/18 C X |
| 3,258,730 | 6/1966 | Husband | 339/18 C |
| 3,448,431 | 6/1969 | Adrien | 174/117 R |
| 3,408,452 | 10/1968 | Ruehlemann | 317/101 CE X |
| 3,353,263 | 11/1967 | Helms | 174/68.5 X |

OTHER PUBLICATIONS

IBM Technical Disclosure Bulletin, Vol. 6, No. 8, Jan. 1964, p. 87 " Circuit Board Connective Scheme," K. J. Roche & P. H. Palmaster

*Primary Examiner*—Marvin A. Champion
*Assistant Examiner*—Terrell P. Lewis
*Attorney*—C. Cornell Remsen, Jr., Walter J. Baum, Paul W. Hemminger, Charles L. Johnson, Jr. and Thomas E. Kristofferson

[57] ABSTRACT

A flat cable wafer for interconnection between a first plurality of conductors imbedded in the wafer in a first plane and a second pair of conductors imbedded in the wafer in a second plane. Each of the first plurality of conductors is positioned so as to be interconnectible with each of the second plurality of conductors, the wafer being formed of an insulating material which, upon application of heat transverse to the plane of the wafer causes at least one of said conductors in each of the plurality of planes to be joined together.

4 Claims, 8 Drawing Figures

INVENTOR.
JAMES L. VADEN
BY [signature]
ATTORNEY

INVENTOR.
JAMES L. VADEN
BY [signature]
ATTORNEY

FLAT CABLE WAFER

The invention relates in general to flat cable wafers and, more particularly, to a flat cable wafer having electrical conductors which can be selectively interconnected.

BACKGROUND OF THE INVENTION

The utilization of flat cable in most system assemblies such as a large aircraft requires some type of junction box. The junction box eliminates the need for dictating the pin assignment in the connectors of the equipment utilizing the system. Thus, wiring changes need not take place in the equipment, but can be made in the junction box. Typically, a large aircraft would have a junction box located in the forward area and one in the aft area, with trunk cables between them. All equipment in the area of the junction box could connect directly thereto and all wiring changes could be made in these boxes.

Where wiring changes need to be made and no junction box is located in the area, the ideal arrangement would be to have an in-the-line junction box that is installed right on the cable run. This installation can be accomplished wherever a plug and receptacle connector are located. The plug and receptacle connectors are disconnected and the junction box adapter inserted between the plug and receptacle. Mounted within the junction box are a plurality of wafers having sets of conductors which provide means for interconnection between sets. Moreover, the wafers contain contacts at each end mating with those of the connectors.

The desired criteria is that any contact on one end can be connected to any other contact on the other end. Heretofore, electrical conductors were mounted crosswise to each other, with an insulating layer therebetween. The insulating member was pierced during the welding or bonding operation, thus providing the electrical and physical connection between the conductors. Unwanted portions of the conductors were then removed from the assembly. Alternatively, with the increased use of flat cable, either uninsulated wire or another flat cable was laid against the flat cable into which interconnections were to be made. A pair of heated electrodes were placed between the parts to be electrically connected. The parts to be electrically connected when squeezed together by the heat of the electrodes, thus fusing themselves through the insulation until the conductive parts which were ultimately to be electrically connected were in physical connection. Finally, a welding current was placed between the electrodes to complete the interconnection.

However, with the use of junction boxes, it has become readily apparent that the wafers used in connection with the junction boxes can be utilized which are ready for rapid interconnect welding. Thus, if a wiring change were to be made, the wafer can be sent to the field for easy replacement. Moreover, for production runs, a mask with a spot weld pattern can be used for easy repetition. Alternatively, where large sizes of flat cable are used, holes can be punched in the wafers and the wafers plated through.

The advantages of this invention, both as to its construction and mode of operation will be readily appreciated as the same become better understood by reference to the following detailed description when considered in connection with the accompanying drawings in which like referenced numerals designate like parts throughout the figures.

DESCRIPTION OF THE PREFERRED EMBODIMENT

Figure 1:
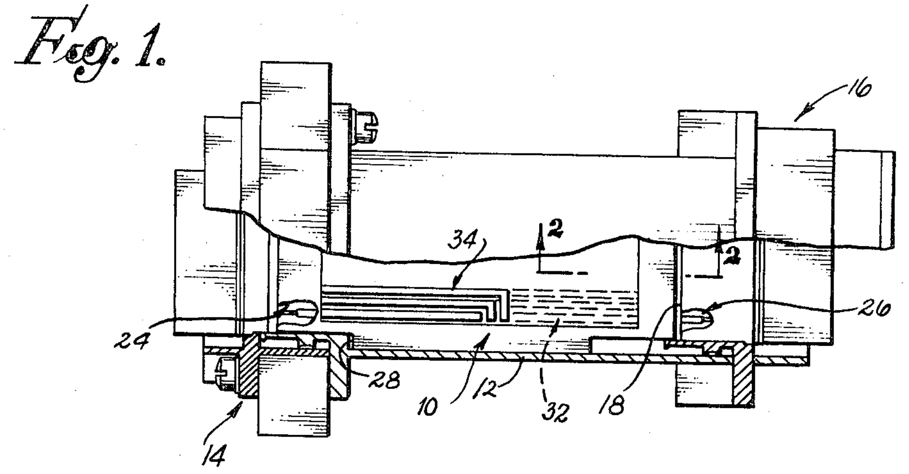
FIG. 1 depicts the wafers of the invention mounted between a pair of electrical connectors, shown partially in section.
Figure 2:
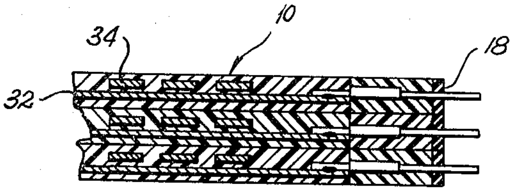
FIG. 2 illustrates a partial sectional view of a portion of the wafers of FIG. 1 taken along the line 2—2 of FIG. 1.

Referring now to the drawings, there is shown in FIGS. 1 and 2 a plurality of wafers 10 mounted in a housing 12 between a receptacle connector 14 and a plug connector 16. The receptacle connector 14 and plug connector 16 each may be part of a junction box with connections to the junction box made through these connectors. An environmental seal 18 such as a rubber grommet may be positioned in the connector bodies abutting the ends of the wafers.

Flat conductors are each positioned in the wafer 10 formed of an insulating body. As shown in FIGS. 3 through 6, the wafer 10 is generally rectangular in shape, except near the pin end 24 and the socket end 26 of the wafer. At these ends the wafer has reduced shoulder portions 28 and 30, respectively, for abutment with a mating receptacle connector 14 and a plug connector 16. Alternatively, of course, it should be understood that the wafers could be made with either pin contacts or socket contacts at both ends rather than with pin contacts at one end and socket contacts at the other end, as shown.

Figure 3:
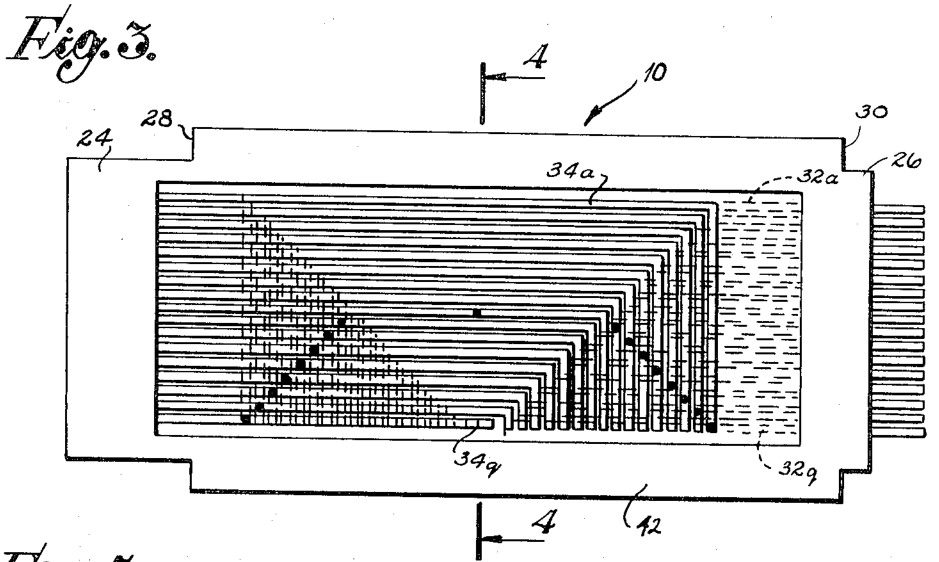
FIG. 3 shows a top view of one of the wafers of FIG. 1 and 2 with a first interconnection pattern between the wafers.
Figure 5:
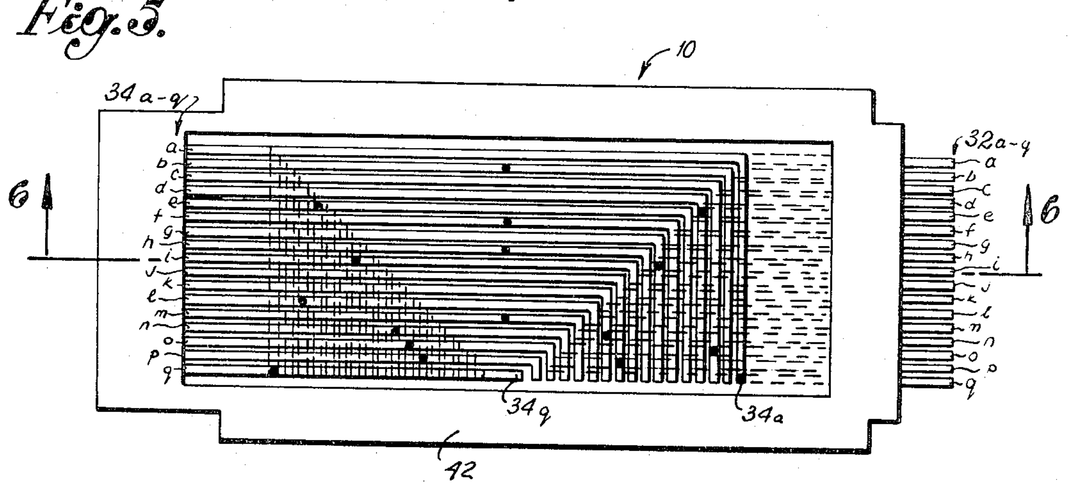
FIG. 5 illustrates an alternative arrangement for interconnecting the conductors of the wafer.
Figure 6:
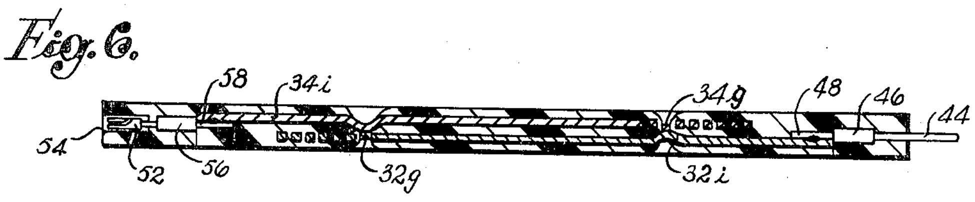
FIG. 6 shows a cross-sectional view of the wafer of FIG. 5 taken along the line 6—6 of FIG. 5.
Figure 4:
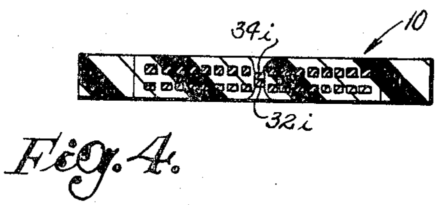
FIG. 4 depicts a cross-sectional view of the wafer of FIG. 3 taken along the lines 4—4 thereof.

Each of the wafers contains a first layer of flat conductors 32 (*a–q*) and a second layer of flat conductors 34 (*a–q*). The first layer of conductors 32 each terminate at the socket end 26. The second layer of conductors 34 are each terminated at the pin end 24. As shown in FIGS. 3 and 5, the conductors 34 extend from the pin end along the axis of the wafer a predetermined length. The outermost conductor 34*a* extends a distance nearly to the end of the wafer adjacent the shoulder 30 and then a portion of the conductors 34*a* extends in a transverse direction across the entire width of the wafer. The next conductor inward from the conductor 34*a*, conductor 34*b*, also extends along the length of the wafer but terminates just prior to the point where conductor 34*a* is connected transversely across the wafer and crosses conductors 32 (*b–q*). However, as can be seen, the portion of the conductor 32*a* directly below the conductor 34*a* is not intersected by the transverse portions of conductors 34*b*. The remainder of the conductors 34 (*c–p*), in turn, are formed of an L-shaped fashion along both the axis and in a transverse direction in the wafer so as to form a plurality of L-shaped conductors therein. However, conductor 34*q* is straight and terminates just short of the transverse portion of the conductor 34*p*.

Similarly, the conductors 32 extend from the socket contact along the length of the wafer and then in a transverse direction with the conductor 32*a* terminating on the opposite end but same side of the wafer from the conductor 34*a* and extending axially along the length of the conductor till nearly the shoulder 28. Conductor 32*q* is straight in the same fashion as the conductor 34*q* and terminates after slightly overlapping the conductor 34*q* lengthwise along the wafer. As will be explained herein, the resultant pattern is a matrix wherein each of the first group of conductors can be connected to any one of the second group of conductors 34 and vice versa as all conductors intersect each other in a transverse plane at one point of the wafer.

As shown in FIGS. 3 and 5 of the drawings, the entire perimeter of the wafer is formed of a frame portion 42 and may be made of dialyll ptholate or epoxy. Socket contacts 44 extend outwardly from the wafer and terminate within the wafer. The socket contacts are normally secured to a contact body portion 46 which, in turn, has a securing end 48 extending into the wafers. The end 48, in turn, is normally welded to its associated flat conductor 32. Similarly, the plug end may contain a plurality of pin contacts 52 which are mounted within cavities 54 of the frame portion of the wafer and are secured to a contact body portion 56. A portion 58 of the pin contacts extend into the wafer from the body portion and are welded, in turn, to a corresponding conductor 34.

In the illustration of FIG. 3, a straight reverse pattern is formed. That is, conductor 32*a* is interconnected with conductor 34*9*, conductor 32*b* is interconnected with conductor 34*p* and so on. In the embodiment of FIG 5, a random interchange between the conductors is illustrated. Thus, for example, as shown in the cross section of FIG. 6, conductor 34*i* is interconnected with conductor 32*g* while conductor 34*g* is interconnected with conductor 32*i*. Thus, as can be readily seen, each of the conductors 32 (*a–q*) can be interconnected with each of the conductors 34 (*a–q*).

Figure 7:
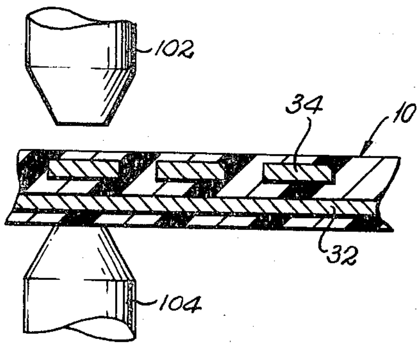
FIG. 7 depicts a cross-sectional view of a typical wafer showing heat electrodes prior to interconnecting conductors in the wafer.
Figure 8:
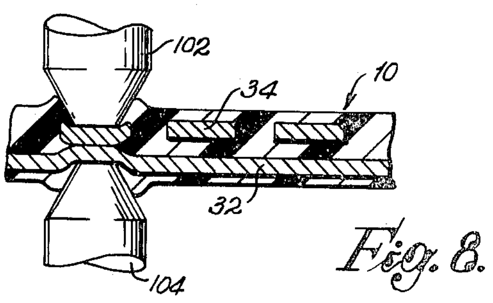
FIG. 8 illustrates a cross-sectional view of the wafer of FIG. 7 after heat has been applied to the wafers and the conductors have been interconnected.

Referring now to FIGS. 7 and 8, there is shown the welding process for utilization with the wafer of FIG. 1 through 6. A pair of electrodes 102 and 104 are positioned so that their ends are adjacent a point near two of the intersecting conductors 32–34 which are to be secured together so as to make an electrical connection therebetween. Upon application of heat to the welding electrodes 102–104, the insulating material of the wafer is melted and as shown in FIG. 8 the force of the welding electrodes causes the two conductors to be joined together. Then, a welding pulse is applied to the electrodes and the final connection between the conductors made. Upon removing the electrodes, an electrical junction is formed between the two conductors.

Further, while the majority of the conductors 32 and 34 are depicted as being L-shaped, it should be understood that other configurations could be utilized.

What is claimed is:

1. A unitary flat cable wafer formed of a single layer of insulating material for interconnection between a first plurality of flat cable conductors imbedded in the wafer in a first plane and a second plurality of flat cable conductors imbedded in the wafer in a second plane, each of said first plurality of conductors being positioned so as to be interconnectible with each of said second plurality of conductors, said wafer being formed of an insulating material which, upon application of heat transverse to the plane of said wafer causes at least one of said conductors in each of said plurality of planes to be joined together.

2. A flat cable wafer in accordance with claim 1 wherein each of said conductors in said first plane intersects each of said conductors in said second plane in planes transverse to the plane of said wafer.

3. A flat cable wafer in accordance with claim 1 wherein termination means are provided at one end of said wafer for said first plurality of conductors and termination means are provided at the other end of said wafer for said second plurality of conductors.

4. A flat cable wafer in accordance with claim 1 wherein said conductors are substantially L-shaped.

* * * * *